US009217088B2

(12) United States Patent
Parashar et al.

(10) Patent No.: US 9,217,088 B2
(45) Date of Patent: *Dec. 22, 2015

(54) PARTICLES AND INKS AND FILMS USING THEM

(75) Inventors: Sachin Parashar, Delhi (IN); Siuli Sarkar, Bangalore (IN); Oscar Khaselev, Monmouth Junction, NJ (US); Brian G. Lewis, Branford, CT (US); Michael T. Marczi, Chester, NJ (US); Bawa Singh, Voorhees, NJ (US); Nitin Desai, Princeton Junction, NJ (US); Michael Liberatore, Jersey City, NJ (US)

(73) Assignee: ALPHA METALS, INC., South Plainfield, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/168,465

(22) Filed: Jun. 24, 2011

(65) Prior Publication Data

US 2011/0318478 A1 Dec. 29, 2011

Related U.S. Application Data

(63) Continuation of application No. 11/462,089, filed on Aug. 3, 2006, now Pat. No. 7,968,008.

(51) Int. Cl.
| | | |
|---|---|---|
| *C09D 11/03* | (2014.01) | |
| *B22F 1/00* | (2006.01) | |
| *B22F 9/24* | (2006.01) | |
| *B82Y 30/00* | (2011.01) | |
| *C09D 7/12* | (2006.01) | |
| *C09D 11/00* | (2014.01) | |
| *C09D 11/38* | (2014.01) | |
| *C23C 24/08* | (2006.01) | |
| *C23C 26/00* | (2006.01) | |
| *H01B 1/02* | (2006.01) | |
| *H01L 51/00* | (2006.01) | |
| *H05K 1/09* | (2006.01) | |
| *C08K 3/08* | (2006.01) | |
| *C08K 9/04* | (2006.01) | |

(52) U.S. Cl.
CPC .............. *C09D 11/03* (2013.01); *B22F 1/0018* (2013.01); *B22F 1/0022* (2013.01); *B22F 1/0062* (2013.01); *B22F 9/24* (2013.01); *B82Y 30/00* (2013.01); *C09D 7/1225* (2013.01); *C09D 7/1266* (2013.01); *C09D 11/00* (2013.01); *C09D 11/38* (2013.01); *C23C 24/08* (2013.01); *C23C 26/00* (2013.01); *H01B 1/02* (2013.01); *H01L 51/0022* (2013.01); *H05K 1/097* (2013.01); *C01P 2002/84* (2013.01); *C01P 2004/62* (2013.01); *C01P 2004/64* (2013.01); *C08K 3/08* (2013.01); *C08K 9/04* (2013.01); *H05K 2201/0224* (2013.01); *Y10T 428/2982* (2015.01); *Y10T 428/2991* (2015.01)

(58) Field of Classification Search
CPC .................. B22F 1/00–1/0003; B22F 1/0014;
B22F 1/0018; B22F 1/0062; B22F 9/24;
B22F 2998/00; C09D 11/52; C09D 11/30;
H01B 1/02; H01B 1/22; C22B 11/04; B82Y 30/00
USPC ............... 252/500, 512–514, 519.3; 428/323,
428/402, 403; 427/96.1, 212, 216, 376.6,
427/383.1; 75/343, 369; 174/254, 257;
438/311, 686
See application file for complete search history.

(56) References Cited

U.S. PATENT DOCUMENTS

| | | | |
|---|---|---|---|
| 5,413,617 | A | 5/1995 | Lin et al. |
| 5,882,722 | A * | 3/1999 | Kydd ............................ 427/98.4 |
| 5,922,403 | A | 7/1999 | Tecle |
| 6,036,889 | A | 3/2000 | Kydd |
| 6,103,868 | A | 8/2000 | Heath et al. |
| 6,660,058 | B1 | 12/2003 | Oh et al. |
| 7,160,525 | B1 * | 1/2007 | Peng et al. ........................ 423/1 |
| 7,968,008 | B2 * | 6/2011 | Parashar et al. ............... 252/500 |
| 2002/0098680 | A1 | 7/2002 | Goldstein |
| 2003/0124259 | A1 * | 7/2003 | Kodas et al. ................ 427/376.6 |
| 2004/0112175 | A1 * | 6/2004 | Ishihara et al. .................. 75/255 |
| 2005/0129843 | A1 | 6/2005 | Wu et al. |
| 2006/0073667 | A1 * | 4/2006 | Li et al. .......................... 438/311 |
| 2006/0154463 | A1 | 7/2006 | Furukawa et al. |
| 2006/0254387 | A1 * | 11/2006 | Lee et al. ......................... 75/252 |
| 2007/0045589 | A1 * | 3/2007 | Ittel ................................ 252/500 |
| 2008/0137316 | A1 | 6/2008 | Khaselev et al. |
| 2008/0145560 | A1 | 6/2008 | Khaselev et al. |
| 2008/0173698 | A1 | 7/2008 | Marczi et al. |

FOREIGN PATENT DOCUMENTS

| | | |
|---|---|---|
| CN | 1803351 A | 7/2006 |
| EP | 1434281 A2 | 6/2004 |

(Continued)

OTHER PUBLICATIONS

Yuning Li et al, "Facile Synthesis of Silver Nanoparticles Useful for Fabrication of High-Conductivity Elements for Printed Electronics," JACS Communications, J. Am. Chem. Soc. 2005, 127, 3266-3267.*
Yiliang Wu et al, "Organic Thin-Film Transistors with Contacts Printed From Metal Nanoparticles," 2005 MRS Spring Meeting, pp. I2.3.1 to I2.3.5.*
Sudip Nath et al, "Silver organosol: synthesis, characterization and localised surface plasmon resonance study," New J. Chem. 2005, 29, 1527-1534.*

(Continued)

*Primary Examiner* — Colleen Dunn
(74) *Attorney, Agent, or Firm* — Lando & Anastasi, LLP

(57) ABSTRACT

Particles and particle films are provided. In certain examples, particles produced from a single phase process may be used to provide industrial scale synthesis of particles for use in devices such as printed wiring boards.

16 Claims, 6 Drawing Sheets

(56) References Cited

FOREIGN PATENT DOCUMENTS

| | | |
|---|---|---|
| EP | 1646095 A2 | 4/2006 |
| JP | 2002-317215 A | 10/2002 |
| JP | 2003253310 A | 9/2003 |
| JP | 2004-183009 A | 7/2004 |
| JP | 2005060816 A | 3/2005 |
| JP | 2005060824 A | 3/2005 |
| JP | 2005093380 A | 4/2005 |
| JP | 2005-536634 A | 12/2005 |
| JP | 2006104576 A | 4/2006 |
| JP | 3796476 B2 | 7/2006 |
| JP | 2006-328532 A | 12/2006 |
| JP | 2006332051 A | 12/2006 |
| JP | 2007046162 A | 2/2007 |
| JP | 2007084879 A | 4/2007 |
| JP | 2007-146271 A | 6/2007 |
| JP | 2007-175619 A | 7/2007 |
| JP | 2007-321216 A | 12/2007 |
| WO | 2005088652 A1 | 9/2005 |
| WO | 2006072959 A1 | 7/2006 |
| WO | 2006076603 A2 | 7/2006 |

OTHER PUBLICATIONS

"General Guidelines for TEM Sample Preparation" The Pennsylvania State University Materials Characterization Laboratory, 2010, p. 1; Web Page from www.mri.psu.edu/facilities/MCL/techniques/TEM/TEMsamples.asp.

Dearden et al. "A Low Curing Temperature Silver Ink for Use in Ink-Jet Printing and Subsequent Production of Conductive Tracks". Macromolecular Rapid Communications, Feb. 21, 2005.

Ding et al. "Synthesis of Metallic Nanoparticales Protected with N, N, N,-Trimethyl Chitosan Chloride via a Relatively Weak Affinity". Nanotechnology vol. 17. pp. 4156-4162. Jul. 28, 2006.

Lee et al. "Direct Synthesis and Inkjetting of Silver Nanocrystals Toward Printed Electronics". Nanotechnology, vol. 17 pp. 2424-2428. Apr. 19, 2006.

Nersisyan et al. "A New and Effective Chemical Reduction Method for Preparation of Nanosized Silver Powder and Colloid Dispersion". Materials Research Bulliten vol. 38, pp. 949-956. 2003.

Rane et al. "Influence of Surfactants Treatment on Silver Powder and its Thick Films". Materials Letters vol. 57, pp. 3096-3100. 2003.

\* cited by examiner

PARTICLES AND INKS AND FILMS USING THEM

FIELD OF THE INVENTION

Certain examples disclosed herein relate generally to methods for use in preparing particles, films and inks. More particularly, certain examples relate to methods of preparing silver particles, silver particle films, and silver particle inks.

BACKGROUND

Fabrication of highly conductive silver thin films are a very important technical process due to its vast spectrum of applications. Silver films are currently used as conducting wires in electronic applications, decorative coatings in the jewelry and fashion industry, antibacterial agents in air and water filtering, antiseptic reagents in medical devices, battery electrodes, metallization layers prior to electroplating and many others applications. Silver thin films can be deposited on different substrates by a number of techniques.

SUMMARY

In accordance with a first aspect, a method of producing particles is provided. In certain examples, the method comprises mixing a metal or a metal salt with a capping agent in a single phase solution. In some examples, the method may further comprise adding a reducing agent to the single phase solution. In other examples, the method may further comprise isolating capped metal particles from the single phase solution. In certain examples, the metal particles may be nanoparticles.

In accordance with another aspect, a method of producing a printed wiring board is disclosed. In certain examples, the method comprises producing capped metal particles from a process comprising mixing a metal or a metal salt with a capping agent in a single phase solution and adding a reducing agent to the single phase solution. In some examples, the method may further include dispersing the capped nanoparticles in a carrier. In other examples, the method may further include disposing the dispersed capped nanoparticles on a substrate. In certain examples, the method may further include heating the substrate. In certain examples, the metal particles may be nanoparticles.

In accordance with an additional aspect, a composition is provided. In certain examples, the composition comprises a carrier and capped particles selected to provide a conductivity of at least about $32 \times 10^4$ S/cm. In some examples, the capped particles are produced by a process comprising mixing a metal or a metal salt with a capping agent in a single phase solution and adding a reducing agent to the single phase solution. In certain examples, the composition may be used to provide an ink.

In accordance with another aspect, a silver film made from capped particles and having a conductivity of at least about $32 \times 10^4$ S/cm is disclosed. In certain examples, the film may be produced using nanoparticles.

It will be recognized by the person of ordinary skill in the art, given the benefit of this disclosure, that the particles, inks, films and methods of producing them provide significant benefits not achievable using prior technologies. Other features, aspects and advantages of the technology disclosed herein are discussed in detail below.

BRIEF DESCRIPTION OF THE FIGURES

Certain examples are described below with reference to the accompanying figures in which.

Figure 1:
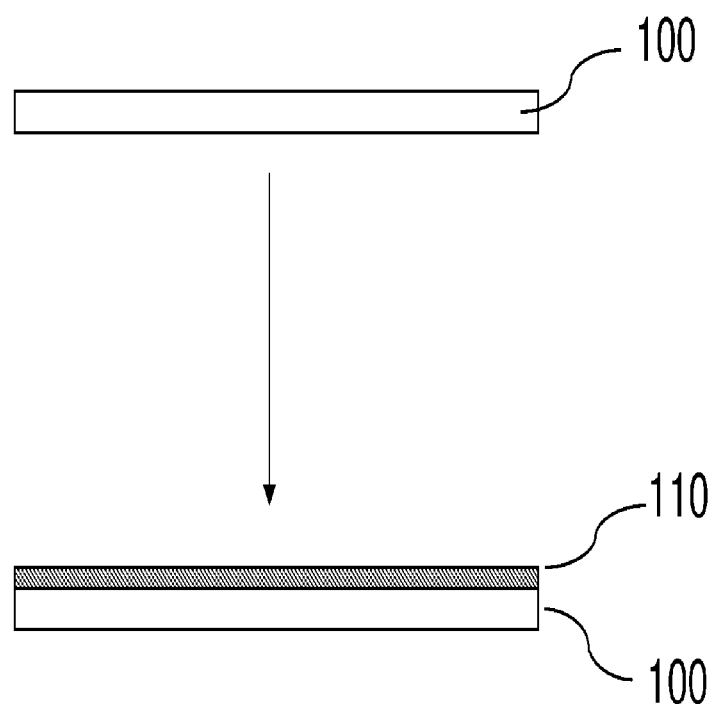
FIG. 1 is a schematic of one embodiment showing disposition of a coating or film on a substrate, in accordance with certain examples.
Figure 2:
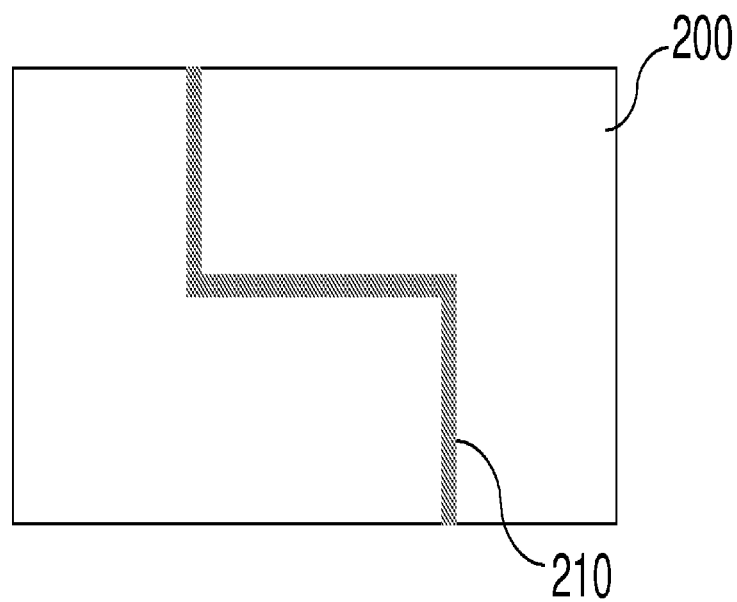
FIG. 2 is a top view of a printed wiring board, in accordance with certain examples.
Figure 3:
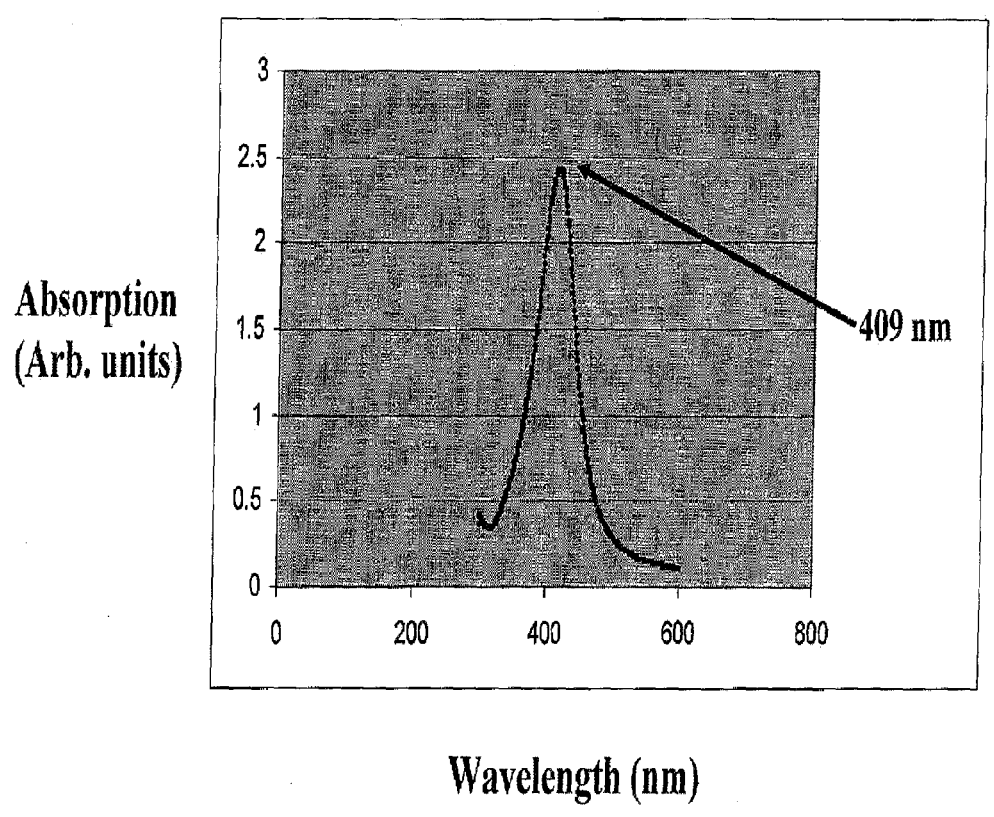
FIG. 3 is an absorption spectrum of hexadecylamine-capped silver particles, in accordance with certain examples.

It will be apparent to the person of ordinary skill in the art, given the benefit of this disclosure, that the exemplary devices, coatings and films shown in FIGS. 1-6C are not necessarily to scale. Certain dimensions, such as the thickness of the coating, films, etc., may have been enlarged relative to other dimensions, for clarity of illustration and for a more user-friendly description of the illustrative examples discussed below.

DETAILED DESCRIPTION

It will be recognized by the person of ordinary skill in the art, given the benefit of this disclosure, that the particles, films, inks and methods provided herein represent a significant development in the preparation of materials and devices employing such particles, films and methods. Devices comprising particles, films and inks can be produced, for example, at low cost, with high uniformity and with selected or desired properties. The use of a single phase reaction to produce the particles provides for low cost, industrial production of a variety of devices that use conductive materials.

As used herein, the term "nanoparticle" refers to a particle having a particle diameter of at least about 5 nanometers to about 500 nanometers, more particularly at least about 5 nanometers to about 100 nanometers, e.g., about 5 nanometers to about 50 nanometers.

There are several drawbacks with existing films of metals. In particular, currently available silver particles have rather poor ability to form thin films. Normally such films are not very conductive, have poor adhesion to the substrate and have poor mechanical integrity. The reason for such shortcomings lies in the surface properties of the silver particles. The heating or fusion process used in preparing the particles relies on surface state or surface activity of particles. Such activity can be influenced by the method of silver particle production and also by the surface oxidation and restructuring during the storage time. If the surface activity of particle is not sufficient during heating, the particles will not completely coalesce but will be connected to each other only in the point of contact by very thin bridges. This result will provide lower conductivity and poor mechanical integrity of the silver thin films. In at least certain embodiments disclosed herein, the methods disclosed herein provide silver films with desirable properties, e.g., high electrical conductivity, good adhesion to the substrate and smooth appearance.

Silver particles are well known materials and available from different commercial sources. Normally, the size of particles ranges from 5 to 70 nm. The known advantage of particles compared to regular silver powder is their ability to be heated or sintered in solid structures at temperatures much lower then melting temperatures. The silver particles can be heated, for example, at temperatures as low as 200° C. The heating process is a diffusion process in which silver migrates from particle to particle forming connecting bridges between particles. The structures formed by heating of currently available silver particles are conductive, but their conductivity is still much lower then that of bulk silver. The reported conductivity is in the range of $1\text{-}2*10^4$ S/cm compared to $62*10^4$ S/cm for the bulk silver. There remains a need for silver films whose conductivity is much closer to that of bulk silver.

In accordance with certain examples, a method of producing a particle is disclosed. In certain examples, the method comprises mixing at least one metal or metal salt and a capping agent in a single phase solution. In certain examples, the metal or metal salt may be selected from conductive metals or conductive metal salts including, for example, transition metals or transition metal salts of gold, silver, copper, nickel, platinum, palladium, iron, and alloys thereof. The exact form of the metal or metal salt may vary depending on the selected solvent system. It is desirable that the metal salt dissolve in the selected solvent system without undue heating that could result in evaporation of the solvent. Illustrative anions of the metal salts include nitrate, chloride, bromide, iodide, thiocyanate, chlorate, nitrite, and acetate. Additional anions are disclosed below in reference to the particular illustrative metal salts disclosed.

In certain examples, the use of a single phase solution to produce the particles permits omission of a phase transfer reagent (though a phase transfer reagent may still be used in certain embodiments) that is commonly used to produce particles in a polyol process. By performing the reaction in a single phase, the ease of producing the particles increases, and the cost of producing the particles decreases. In addition, large scale, industrial synthesis of the particles may be achieved using a single phase reaction. Additional benefits of the particles, and methods of producing them, will be readily selected by the person of ordinary skill in the art, given the benefit of this disclosure.

In accordance with certain examples, a silver salt may be used to provide a particle. In instances where a silver salt is used, the silver salt may be one or more of silver chloride, silver bromide, silver iodide, silver thiocyanate, silver sulfate, silver chromate, silver phosphate, silver oxalate, silver carbonate, silver sulfite, silver hydroxide, silver nitrate, silver chlorate, silver acetate, silver nitrite, silver acetylacetonate, silver lactate, silver (II) fluoride, silver (I) hydrogenfluoride, silver (I) permanganate, silver metavanadate, silver trifluoroacetate, potassium dicyanoargentate, silver benzoate, silver arsenate, silver bromate, silver cyclohexanebutyrate, silver fluorosulfate, silver hexafluoroantimonate (V), silver hexafluoroarsenate(V), silver hexafluorophosphate, silver (I) fluoride, silver (I) oxide, silver (I) perrhenate, silver (I) selenide, silver (I) telluride, silver iodate, silver orthophosphate, silver sulfide, and silver tungstate. Additional suitable silver salts will be readily selected by the person of ordinary skill in the art, given the benefit of this disclosure.

In accordance with certain examples, a gold salt may be used to provide a particle. In instances where a gold salt is used, the gold salt may be one or more of gold(III) chloride hydrate, hydrogen tetrachloroaurate(III) hydrate, chloro (dimethylsulfide)gold (I), gold (I) chloride, gold colloid, gold (I) cyanide, gold (I) iodide, gold (I) sulfide, gold (III) bromide hydrate, gold (III) chloride, gold (III) chloride trihydrate, gold (III) hydroxide, gold (III) oxide hydrate, gold (III) sulfide, potassium dicyanoaurate (I), potassium gold (III) chloride, and sodium tetrachloroaurate(III) dehydrate. Additional suitable gold salts will be readily selected by the person of ordinary skill in the art, given the benefit of this disclosure.

In accordance with certain examples, a copper salt may be used to produce a particle. In instances where a copper salt is used, either the cuprous form (copper (I)) or the cupric form (copper (II)) may be used. Illustrative copper salts include, but are not limited to, copper (I) chloride, copper (II) chloride, copper (I) bromide, copper (II) bromide, copper (I) iodide, copper (II) iodide, copper mercuric iodide, copper (I) tetraiodomercurate (II), cuprous thiocyanate, copper (II) sulfate, copper(II) acetylacetonate, ammonium tetrachlorocuprate (II) dihydrate, copper aluminum oxide, copper chromite, ethylenediaminetetraacetic acid diammonium copper salt solution, ethylenediaminetetraacetic acid copper(II) disodium salt, copper (I) acetate, copper (I) cyanide, copper (I) oxide, copper (I) selenide, copper (I) sulfide, copper (I) telluride, copper (I) thiophenolate, copper (II) acetate, copper(II) acetate hydrate copper (II) acetate monohydrate, copper (II) carbonate, copper (II) hydroxide, copper (II) molybdate, copper (II) niobate, copper (II) nitrate, copper (II) selenide, copper (II) selenite dehydrate, copper (II) sulfate, copper (II) sulfide, copper (II) telluride, tris(ethylenediamine)copper (II) sulfate, and combinations thereof. Additional suitable copper salts will be readily selected by the person of ordinary skill in the art, given the benefit of this disclosure.

In accordance with certain examples, an aluminum salt may be used. In instances where an aluminum salt is used, the aluminum salt may be, for example, one or more of aluminum acetate, aluminum phosphate monobasic, aluminum sulfate, aluminum ethoxide, aluminum potassium sulfate, aluminum silicate, aluminum acetate, aluminum arsenide, aluminum bromide, aluminum chloride, aluminum chloride hydrate, aluminum fluoride, aluminum fluoride hydrate, aluminum fluoride trihydrate, aluminum hydroxide, aluminum iodide, aluminum sulfide, aluminum nitrate, aluminum thiocyanate, aluminum chlorate, and aluminum nitrite. Additional suitable aluminum salts will be readily selected by the person of ordinary skill in the art, given the benefit of this disclosure.

In accordance with certain examples, a platinum salt may be used. In instances where a platinum salt is used, the platinum salt may be, for example, one or more of platinum (II) acetylacetonate, platinum (IV) chloride, platinum(IV) oxide, platinum (II) bromide, platinum (II) chloride, platinum (II) cyanide, platinum (II) hexafluoroacetylacetonate, platinum (II) iodide, platinum (IV) sulfide, and platinum nitrate. Additional suitable platinum salts will be readily selected by the person of ordinary skill in the art, given the benefit of this disclosure.

In accordance with certain examples, a palladium salt may be used. In instances where a palladium salt is used, the palladium salt may be, for example, one or more of palladium (II) acetylacetonate, palladium(II) trifluoroacetate, palladium hydroxide, palladium (II) acetate, palladium(II) bromide, palladium (II) chloride, palladium(II) cyanide, palladium(II) hexafluoroacetylacetonate, palladium(II) iodide, palladium (II) nitrate dehydrate, palladium(II) nitrate hydrate, palladium(II) oxide, palladium (II) propionate, palladium (II) sulfate, palladium (II) sulfide, and palladium on alumina. Additional suitable palladium salts will be readily selected by the person of ordinary skill in the art, given the benefit of this disclosure.

In accordance with certain examples, a cobalt salt may be used. In instances where a cobalt salt is used, the cobalt salt may be, for example, one or more of ammonium cobalt(II) sulfate hexahydrate, cobalt chloride, cobalt (II) acetate, cobalt (II) acetate tetrahydrate, cobalt (II) acetylacetonate, cobalt (II) acetylacetonate hydrate, cobalt (II) bromide, cobalt (II) chloride, cobalt (II) chloride hexahydrate, cobalt (II) chloride hydrate, cobalt (II) cyanide dehydrate, cobalt (II) iodide, cobalt (II) thiocyanate, cobalt (II) nitrate hexahydrate, and cobalt (III) acetylacetonate. Additional suitable cobalt salts will be readily selected by the person of ordinary skill in the art, given the benefit of this disclosure.

In accordance with certain examples, a chromium salt may be used. In instances where a chromium salt is used, the chromium salt may be, for example, one or more of chromium (III) acetylacetonate, chromium (II) acetate, chromium (II) chloride, chromium(II) fluoride, chromium (II) selenide, chromium (III) acetate hydroxide, chromium (III) bromide hexahydrate, chromium (III) chloride, chromium (III) chloride hexahydrate, chromium (III) chloride hydrate, chromium (III) fluoride, chromium (III) sulfate hydrate, chromium (III) telluride, chromium silicide, and chromium nitrate. Additional suitable chromium salts will be readily selected by the person of ordinary skill in the art, given the benefit of this disclosure.

In accordance with certain examples, an indium salt may be used. In instances where an indium salt is used, the indium salt may be, for example, one or more of indium (III) acetylacetonate, indium antimonide, indium (I) bromide, indium (I) chloride, indium (I) iodide, indium (II) chloride, indium (III) acetate, indium (III) acetate hydrate, indium (III) bromide, indium (III) chloride, indium (III) chloride hydrate, indium (III) chloride tetrahydrate, indium (III) fluoride, indium (III) fluoride trihydrate, indium (III) hydroxide, indium (III) iodide, indium (III) nitrate hydrate, indium (III) nitrate hydrate, indium (III) nitrate pentahydrate, indium (III) nitride, indium (III) oxide, indium (III) perchlorate hydrate, indium (III) selenide, indium (III) sulfate, indium (III) sulfate hydrate, and indium (III) telluride. Additional suitable indium salts will be readily selected by the person of ordinary skill in the art, given the benefit of this disclosure.

In accordance with certain examples, a nickel salt may be used. In instances where a nickel salt is used, the nickel salt may be, for example, one or more of nickel(II) acetylacetonate, nickel (II) acetate tetrahydrate, nickel (II) carbonate hydroxide tetrahydrate, nickel (II) octanoate hydrate, nickel sulfide, nickel carbonate, nickel (II) bromide, nickel (II) bromide hydrate, nickel (II) bromide trihydrate, nickel (II) carbonate basic hydrate, nickel (II) chloride, nickel (II) chloride hexahydrate, nickel (II) chloride hydrate, Nickel(II) cyclohexanebutyrate, nickel (II) fluoride, nickel (II) fluoride tetrahydrate, nickel (II) hexafluoroacetylacetonate hydrate, nickel (II) hydroxide, nickel (II) iodide, nickel (II) molybdate, nickel (II) nitrate hexahydrate, nickel (II) oxalate dehydrate, nickel (II) oxide, nickel (II) perchlorate hexahydrate, nickel (II) peroxide hydrate, nickel (II) phosphide, nickel (II) stearate, nickel (II) sulfate hexahydrate, and nickel on silica. Additional suitable nickel salts will be readily selected by the person of ordinary skill in the art, given the benefit of this disclosure.

In accordance with certain examples, an iridium salt may be used. In instances where an iridium salt is used, the iridium salt may be, for example, one or more of iridium (III) acetylacetonate, iridium (III) bromide hydrate, iridium(III) chloride, iridium (III) chloride hydrate, iridium (III) chloride hydrochloride hydrate, iridium (IV) chloride hydrate, iridium (IV) oxide, iridium (IV) oxide hydrate and iridium nitrate. Additional suitable iridium salts will be readily selected by the person of ordinary skill in the art, given the benefit of this disclosure.

In accordance with certain examples, a rhodium salt may be used. In instances where a rhodium salt is used, the rhodium salt may be, for example, one or more of rhodium (III) acetylacetonate, rhodium (II) acetate dimmer, rhodium (II) acetate dimer dehydrate, rhodium (II) heptafluorobutyrate, rhodium (II) hexanoate, Rhodium(II) octanoate dimer, rhodium (II) trifluoroacetate dimer, rhodium (II) trimethylacetate dimer, rhodium (III) bromide hydrate, rhodium (III) chloride, rhodium (III) chloride hydrate, rhodium (III) iodide hydrate, rhodium (III) nitrate hydrate, rhodium (III) oxide, rhodium (III) oxide hydrate, rhodium (III) phosphate solution, sodium hexachlororhodate(III) dodecahydrate, rhodium (III) sulfate solution, rhodium (IV) oxide, rhodium on activated alumina, rhodium on activated charcoal, tris(ethylenediamine)rhodium(III) chloride, and tris(ethylenediamine)rhodium(III) nitrate. Additional suitable rhodium salts will be readily selected by the person of ordinary skill in the art, given the benefit of this disclosure.

In accordance with certain examples, an osmium salt may be used. In instances where an osmium salt is used, the osmium salt may be, for example, one or more of osmium (III) chloride hydrate, osmium tetrachloride, osmium tetroxide, osmium trichloride and tetraosmium-nitrate. Additional suitable osmium salts will be readily selected by the person of ordinary skill in the art, given the benefit of this disclosure.

In accordance with certain examples, an iron salt may be used. In instances where an iron salt is used, the iron salt may be, for example, one or more of iron (III) acetylacetonate, iron (II) acetylacetonate, iron ascorbate, ammonium iron (II) sulfate hexahydrate, iron (III) citrate tribasic monohydrate, iron (II) gluconate dehydrate, iron (III) pyrophosphate, iron (II) phthalocyanine, iron (III) phthalocyanine chloride, ammonium iron (III) citrate, ammonium iron (II) sulfate, ammonium iron (III) sulfate, ammonium iron (III) sulfate dodecahydrate, iron (III) chloride, iron (III) bromide, iron (III) chloride hexahydrate, ferric citrate, iron (III) fluoride, iron (III) nitrate nonahydrate, iron (III) oxide, iron (III) phosphate, iron (III) sulfate hydrate, iron (II) bromide, iron (II) chloride, iron (III) phosphate hydrate, iron (III) phosphate tetrahydrate, iron (II) chloride hydrate, iron (II) chloride tetrahydrate, iron (II) ethylenediammonium sulfate tetrahydrate, iron (II) fluoride, iron (II) gluconate hydrate, iron (II) iodide, iron (II) lactate hydrate, iron (II) oxalate dehydrate, ferrous sulfate heptahydrate, iron (II) sulfide, iron (II) acetate, iron (II) fluoride tetrahydrate, iron (II) iodide tetrahydrate, iron (II) molybdate, iron (II) oxide, iron (II) perchlorate hydrate, iron (II) titanate, and iron (III) ferrocyanide. Additional suitable iron salts will be readily selected by the person of ordinary skill in the art, given the benefit of this disclosure.

In accordance with certain examples, a ruthenium salt may be used. In instances where a ruthenium salt is used, the ruthenium salt may be, for example, one or more of ruthenium (III) acetylacetonate, ruthenium(IV) oxide, ammonium hexachlororuthenate (IV), ruthenium (III) chloride, ruthenium on activated charcoal, ruthenium on alumina, ruthenium on carbon, ruthenium(III) bromide, ruthenium(III) chloride hydrate, ruthenium(III) chloride trihydrate, ruthenium(III) iodide, ruthenium(III) nitrosyl chloride hydrate, ruthenium (III) nitrosyl nitrate solution, and ruthenium(IV) oxide hydrate. Additional suitable ruthenium salts will be readily selected by the person of ordinary skill in the art, given the benefit of this disclosure.

In accordance with certain examples, the metal used to provide the particles and films disclosed herein may be uncomplexed or may be complexed with one or more ligands. For example, the metal may be complexed with EDTA, ethylenediamine, oxalate, 2,2'-bypyridine, cyclopentadiene, diethylenetriamine, 2,4,6,-trimethylphenyl, 1,10-phenanthroline, triethylenetetramine or other ligands.

In certain examples, the metal or metal salt may be dissolved in a solvent or a solvent system to provide a clear, but not necessarily colorless, solution. For example, a suitable amount of metal or metal salt may be added to a solvent such that when the metal or metal salt goes into solution, the overall solution is clear. The overall solution may be colored or may be coloress. Suitable solvents include, but are not limited to, ethylene glycol, methanol, ethanol, propanol, isopropanol, butanol, isobutyl alcohol, pentanol, isopentanol, hexanol and aliphatic alcohols having from about 1 to about 10 carbon atoms. Additional suitable solvents include, but are not limited to, benzene, toluene, butylenes, polyisobutylene, Isopar® solvents commercially available from Exxon and aromatic compounds having aliphatic side chains that include 2-6 carbon atoms. Suitable solvent systems include mixtures of the illustrative solvents discussed herein and other liquids that are soluble, miscible or partially miscible with such illustrative solvents. In certain examples, the combination of solvents provides a single phase. To achieve a single phase when using a mixture of solvents, the amounts of each solvent may be adjusted such that a single phase results when the solvents are mixed. Should more than one phase be present upon mixing, the relative amounts of one or more of the solvents can be altered, e.g., increased or decreased, until a single phase is observed.

In accordance with certain examples, the method may further include adding a capping agent to the metal salt dissolved in the solvent or solvent system. The capping agent may be effective to isolate the particle and limit the size of its growth. In certain examples, the capping agent is a high molecular weight capping agent, e.g., has a molecular weight of at least about 100 g/mol. Illustrative capping agents include, but are not limited to, organic amines having 12 or more carbon atoms. In certain examples, the organic amine has at least 16 carbon atoms, e.g., hexadecylamine. The organic moiety of the amine may be saturated or unsaturated and may optionally include other functionalities such as, for example, thiols, carboxylic acids, polymers, and amides. Another group of illustrative capping agents suitable for use in the methods disclosed herein are thiols having 12 or more carbon atoms. In certain examples, the thiol has at least 6 carbon atoms. The organic moiety of the thiol may be saturated or unsaturated and may optionally include other functionalities such as, for example, pyrrole and the like. Another group of capping agents suitable for use are pyridine based capping agent such as, for example, triazolopyridine, terpyridine and the like. Additional suitable capping agents will be readily selected by the person of ordinary skill in the art, given the benefit of this disclosure.

In certain examples where a capping agent is used, the capping agent may be dissolved in a suitable solvent prior to addition to the metal solution. For example, the capping agent may be dissolved in a solvent and the solution can be mixed with the metal solution. In other examples, the capping agent may be added as a solid or liquid directly to the metal solution without prior dissolution in a solvent. The capping agent may be added, for example, in incremental steps or may be added in a single step.

In accordance with certain examples, the amount of capping agent added to the metal solution may vary depending on the desired properties of the resulting capped particles. In some examples, a suitable amount of capping agent is added to provide at least about 2% by weight capping agent in the capped particles. It will be recognized by the person of ordinary skill in the art, given the benefit of this disclosure, that it may be desirable to use more or less capping agent depending on the desired properties of the particles. For example, to increase the conductivity of particles disposed on a substrate, e.g., a printed wiring board, it may be desirable to adjust the amount of capping agent until the conductivity is optimized or falls within a desired range. It will be within the ability of the person of ordinary skill in the art, given the benefit of this disclosure, to select suitable amounts of capping agent.

In certain examples, when a capping agent (or a capping agent solution) and the metal salt solution are mixed, a single phase results or remains. In an alternative embodiment, the metal salt solution could be a single phase prior to addition of the capping agent or capping agent solution, and, upon addition of the capping agent or capping agent solution a single phase remains. Additional embodiments where a metal solution and a capping agent are mixed to provide a single phase will be readily selected by the person of ordinary skill in the art, given the benefit of this disclosure.

In certain examples, the capping agent and the metal solution may be mixed using conventional techniques such as stirring, sonication, agitation, vibration, shaking or the like. In some examples, the capping agent is added to the metal solution while the metal solution is being stirred. In certain examples, the mixture of capping agent and metal solution may be stirred until a clear and/or colorless single phase solution results.

In accordance with certain examples, the method may further include adding a reducing agent to the metal-capping agent solution. Suitable reducing agents include agents that can convert the metal ions dissolved in the solution to metal particles that, under selected conditions, will precipitate out of solution. Illustrative reducing agents include, but are not limited to, sodium borohydride, lithium aluminum hydride, sodium cyanoborohydride, potassium borohydride, sodium triacetoxyborohydride, sodium diethyldihydridoaluminate, sodium tri- or tert-butoxohydridoaluminate, sodium bis(2-methoxyethoxo) dihydridoaluminate, lithium hydride, calcium hydride, titanium hydride, zirconium hydride, diisobutylaluminum dydride (DIBAL-H), dimethylsulfide borane, ferrous ion, formaldehyde, formic acid, hydrazines, hydrogen gas, isopropanol, phenylsilane, polymethylhydrosiloxane, potassium ferricyanide, silanes, sodium hydrosulfite, sodium amalgam, sodium (solid), potassium (solid), sodium dithionite, stannous ion, sulfite compounds, tin hydrides, triphenylphosphine and zinc-mercury amalgam. The exact amount of reducing agent added to the metal-capping agent solution may vary, but typically the reducing agent is added in excess such that substantially all of the dissolved metal is converted from a charged state to an uncharged state, e.g., $Ag^{+1}$ is converted to $Ag^0$.

In some examples, the reducing agent is dissolved in a solvent prior to addition to the metal-capping agent solution, whereas in other examples, the reducing agent is added to the metal-capping agent solution without prior dissolution. When a solvent is used to dissolve the reducing agent, the solvent is preferably non-reactive such that the solvent is not altered or changed by the reducing agent. Illustrative solvents for use with the reducing agent include, but are not limited to, tetrahydrofuran (THF), N,N-dimethylformamide (DMF), ethanol, toluene, heptane, octane and solvents having six or more carbon atoms. The person of ordinary skill in the art, given the benefit of this disclosure, will be able to select suitable solvent for dissolving the reducing agent.

In accordance with certain examples, the reducing agent and capping agent-metal solution may be mixed or stirred for a sufficient time to permit reaction of the reducing agent with the metal. In some examples, the stirring may be performed at room temperature, whereas in other examples the stirring or mixing is performed at an elevated temperature, e.g., about 30° C. to about 70° C., to speed the reduction process. When an elevated temperature is used, it is desirable to keep the temperature below the boiling point of the solvent or solvent system to reduce the likelihood of solvent evaporation, though in some examples, it may be desirable to reduce the overall volume of solvent.

In accordance with certain examples, the method may further include isolating the capped metal particles from the single phase solution. Isolation may occur, for example, by decanting, centrifugation, filtering, screening or addition of another liquid that the capped metal particles are insoluble in, e.g., extraction. For example, a liquid, such as methanol, acetone, water or a polar liquid, may be added to an organic solution obtained from adding metal salt, capping agent and reducing agent to an organic solvent or organic solvent system. In certain examples, multiple, separate additions of the extraction liquid may be added to the solution to remove the capped metal particles. For example, a first amount of extraction liquid may be added to remove some of the metal particles. This first amount of extraction liquid may then be removed, decanted or otherwise separated from the organic solution, and additional amounts of the extraction liquid may be added to the organic solution. The exact amount of extraction liquid used to isolate the metal particles may vary depending on the volume of solvent used to produce the capped metal particles. In some examples, about two to four times or more solvent is used to extract the capped metal particles, e.g., if the metal particles are produced in about five Liters of solvent, then about 20 Liters or more of extraction liquid may be used. It will be within the ability of the person of ordinary skill in the art, given the benefit of this disclosure, to select suitable solvents and amounts of suitable solvents.

In accordance with certain examples, the capped particles may be separated from the extraction liquid using conventional techniques such as decanting, centrifugation, filtration and the like. In some examples, the extraction liquid may be evaporated leaving the capped particles. The capped particles may be washed, sized, heated or otherwise processed prior to, during or after separation from the extraction liquid. In certain embodiments, the extraction liquid may be used, optionally along with one or more solvents, as a carrier fluid to provide an ink, as discussed in more detail herein.

In accordance with certain examples, the capped particles may be dried to remove any residual liquids. For example, the capped particles may be dried in an oven, may be dried using a vacuum, or may be subjected to lyophilization to otherwise remove any residual extraction liquid and/or solvent. The dried, capped particles may be stored at room temperature optionally in a sealed container to prevent moisture entry.

In accordance with certain examples, the capped particles may be processed to remove the capping agent prior to use. The capping agent typically remains on the surface of the particles after the reaction, but the presence of a capping agent may be undesirable. For example, where it is desirable to use particles with the lowest level of organic contamination possible, it would be advantageous to remove the capping agent from the capped particles. In certain embodiments, the capped particles may be processed until the level of capping agent is reduced below about 2% by weight, more particularly reduced to below about 1% by weight, e.g., the capping agent is present at less than 0.5% or 0.1% by weight.

In accordance with certain examples, the metal particles may be used to produce inks. In some examples, a selected amount of particles are dispersed in a carrier to provide an ink. The exact amount of the particles selected may vary, and typically a suitable amount of particles (either capped or uncapped) are used to provide a dispersion including about 10-90 weight percent particles, more particularly about 20-80 weight percent particles, e.g., about 20-25 weight percent particles. In embodiments where capped particles are used, the amount of the capped particles used may be altered to account for the additional weight added by the capping agent. In other examples, a sufficient amount of particles are used to provide a desired viscosity for the dispersion. For example, the viscosity of the dispersion may vary depending on the method or devices that the ink is to be used in. In examples where the ink is intended to be used in spin coating applications, a sufficient amount of particles may be selected to provide an ink viscosity of about 0.25 centiPoise to about 2 centiPoise, more particularly about 0.5 centiPoise to about 1.5 centiPoise, e.g., about 1 centiPoise. In examples where the ink is intended to be used in inkjet printing applications, a sufficient amount of particles may be selected to provide an ink viscosity of about 5 centiPoise to about 20 centiPoise, more particularly about 7 centiPoise to about 15 centiPoise, e.g., about 8-10 or 8-9 centiPoise.

In accordance with certain examples, the carrier of the ink may be any medium or fluid, e.g., a liquid or a gas, that can effectively disperse the particles in a selected manner, e.g., spin coating, inkjet printing, paste printing, etc. In certain examples, the carrier may be a volatile organic medium that can be evaporated or removed to leave a coating or film of the particles. Illustrative volatile organic media include, but are not limited to, toluene, hexanes, and saturated and unsaturated hydrocarbons including from about 4 to about 10 carbon atoms. Additional suitable carriers will be readily selected by the person of ordinary skill in the art, given the benefit of this disclosure.

In accordance with certain examples, the ink or inks may be disposed on a substrate. Illustrative substrates include, but are not limited to, papers, glasses, silicone wafers, and polymer films. In certain examples, the ink may be disposed on the substrate in a suitable manner to produce a film. For example and referring to FIG. 1, an ink may be disposed on a substantially planar surface of a substrate 100 such that a film 110 remains after the carrier is removed. The exact thickness of the film 110 may vary depending on the selected application of the film. In embodiments where the film is to be used as a light reflector, the thickness of the film may vary, for example, from about 0.2 microns to about 1 micron. In embodiments where the film is to be used as current conductor, the thickness of the film may vary, for example, from about 0.2 microns to about 20 microns. Additional film thicknesses for an intended use will be readily selected by the person of ordinary skill in the art, given the benefit of this disclosure.

In accordance with certain examples, the ink or inks may be processed prior to use. In certain embodiments, the ink may be mixed with dyes, other inks or other materials prior to use. In other embodiments, the ink may be heated, screened, filtered or the like prior to use. In certain examples, the particles may be heated, screened, filtered or the like prior to disposition in a carrier to provide an ink. In certain embodiments employing the capped particles disclosed herein, heating permits the particles to coalesce and form highly conductive thin films that may be used, for example, in circuits, printed wiring boards and the like. For example and referring to FIG. 2, a substrate 200 includes a film pattern 210 that may be operative to function as part of an electrical circuit, e.g., may function as an interconnect. The film pattern can be created using numerous different methods. In one embodiment, a film may be disposed substantially over the entire surface of the substrate 200 and a pattern can be etched away, or otherwise created, to provide a desired pattern. In another embodiment, a mask can be disposed on the substrate prior to film disposition such that upon removal of the mask a desired film pattern remains. Additional embodiments for disposing inks on a substrate to create a desired pattern will be readily selected by the person of ordinary skill in the art, given the benefit of this disclosure. Illustrative uses for the particle films and patterns include, but are not limited to, printed electrical circuits, radio frequency identification (RFID) antennas, solar cell wires, battery electrodes, and reflective surfaces and mirrors.

In embodiments where a particle dispersion or an ink is subjected to heating, heating is typically performed using a hot-plate, oven (high temperature convection oven, reflow oven, IR oven, etc.), laser heating or other methods and devices that can increase the temperature of the particle dispersion or the ink. In certain examples, the particle dispersion or the ink may be heated to at least about 250° C. for 10-60 seconds, e.g., 250° C. for 30 seconds. In other examples, sequential heating may be performed such that the particle dispersion or ink is heated at a first temperature for a selected time followed by heating at a second temperature for a selected time. For example, the particle dispersion or the ink may be heated at about 110-130° C. for 10-30 seconds, e.g., 120° C. for 20 seconds, followed by a second heating step at 250-300° C. for 10-60 seconds, e.g., 280° C. for 20 seconds. Subsequent to heating, the particles and inks may be subjected to other processing steps.

In accordance with certain examples, the film may be disposed using numerous methods and devices. For example, spin coating, ink jet printing, paste printing, screen printing, gravure printing, wire-bar coating, blade coating, roller coating, dip coating or other coating or printing methods may be used to dispose the ink on a substrate. Subsequent to disposition of the ink, the ink-substrate assembly may be subjected to heating, a vacuum or other processing steps to remove any ink carrier from the ink-substrate assembly.

In accordance with certain examples, the particles and inks disclosed herein may be used in conductive adhesive type applications. For example, the particles may be mixed with one or more adhesives to provide an adhesive that includes conductive particles. In certain embodiments, capped particles may be dispersed within a polymeric adhesive and, as the adhesive is cured, e.g., by heating, the carrier, or in certain cases the cappant, may be removed from the particle to provide metal particles dispersed in an adhesive matrix. Suitable adhesives for use with the particles disclosed herein include, for example, thermoplastic and thermoset adhesives. Specific adhesives for use with the particles disclosed herein will be readily selected by the person of ordinary skill in the art, given the benefit of this disclosure.

In accordance with certain examples, the particles and inks disclosed herein may be used to provide alloys. In certain examples, the capped particles disclosed herein may be used to provide a core-shell structure where the metal of the capped particle acts as a shell and another metal or metal alloy would act as a core. For example, a tin-copper alloy may be used as a core and silver particles (capped or uncapped) may be used as a shell to provide a type of SAC alloy, e.g., a nano SAC alloy. The exact process used to produce the alloy may vary, and in certain examples the alloy may be produced by dissolving ions of other metals, e.g., $Sn^{2+}$, $Cu^{2+}$, etc., in a dispersion of uncapped silver particles. The mixture may be subjected to reduction or other steps to produce an alloy having selected properties.

Certain specific examples are described below to illustrate further the novel technology disclosed herein.

EXAMPLE 1

A batch of silver particles was prepared by adding 108 grams of silver nitrate to 200 millimeters (mL) of ethylene glycol to provide a silver nitrate concentration of 3.2 moles/Liter. The entire 200 mL solution was added to 1500 mL of ethanol to which 2750 mL toluene was added in order to obtain a single phase mixture (provided a 1:1.83 mixture of ethanol:toluene).

In a first reaction, 318.7 grams of hexadecylamine was added to the single phase mixture, and a single phase remained after stirring. To this clear solution, 250 mL of a sodium borohydride solution in N,N-Dimethyl formamide (11.349 grams of sodium borohydride dissolved in 250 mL of N,N-Dimethyl formamide) was added drop-wise as a reducing agent to form a dark yellowish brown solution of about 4.7 liters in volume. The reaction mixture was allowed to stir for 30 minutes at about 22° C., and capped silver particles were extracted by adding 20 L of methanol or 20 L of acetone. The capped particles were removed by separatory funnel followed by centrifugation at 500 rpm for 30 minutes using a Rousselet Robatel® RC 20 centrifuge. The capped particles were dried in a vacuum to obtain a free flowing powder of nanocrystalline capped silver particles having about 18% hexadecylamine.

In a second reaction, 24 grams of dodecylamine was added to the single phase mixture and a single phase remained after stirring. To this clear solution, 250 mL of a sodium borohydride solution in N,N-Dimethyl formamide (11.349 grams of sodium borohydride dissolved in 250 mL of N,N-Dimethyl formamide) was added drop-wise as a reducing agent to form a dark yellowish brown solution of about 4.7 liters in volume. The reaction mixture was allowed to stir for 30 minutes at about 22° C., and capped silver particles were extracted by adding 20 L of methanol or 20 L of acetone. The capped particles were removed by separatory funnel followed by centrifugation at 500 rpm for 30 minutes in a Rousselet Robatel® RC 20 centrifuge. The capped particles were dried in a vacuum to obtain a free flowing powder of nanocrystalline capped silver particles having about 8% dodecylamine.

Figure 4:
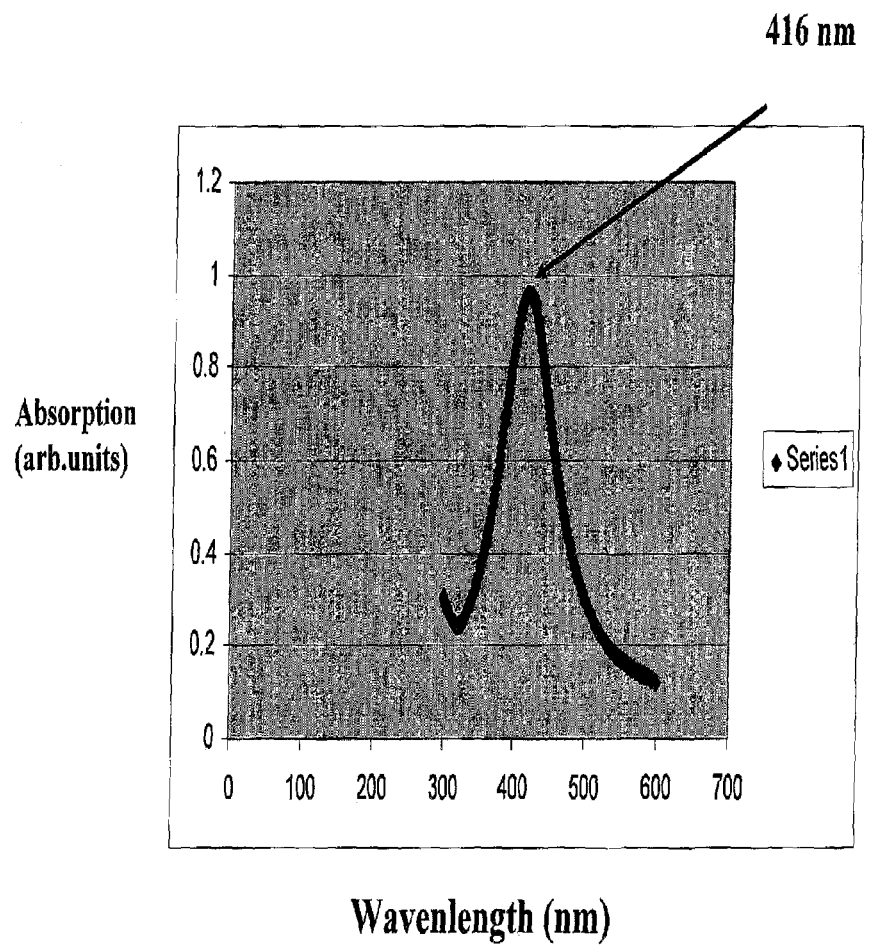
FIG. 4 is an absorption spectrum of dodecylamine-capped silver particles, in accordance with certain examples.

UV absorption spectra were obtained on methanol extracted hexadecylamine-capped silver particles (FIG. 3) and methanol extracted dodecylamine-capped silver particles (FIG. 4). Each of the capped particle samples was dispersed in toluene, and a clear absorption at 409-416 nm was observed using a Hewlett-Packard® UV-Visible Spectrophotometer (Model No.: HP8452A) and a 1 cm path length disposable cuvette. An absorbance at 409-416 nm absorption is typical of nanocrystalline silver.

EXAMPLE 2

Depending on the applications for which the metal particles are intended, different loading rates may be used. The following loading rates have been used to produce particles. In parenthesis is the liquid used to extract the metal particles from the single phase solution.

| Sample | Percent Loading (%) |
|---|---|
| Ag-HDA (Methanol ppt) | 18.69 |
| Ag-HDA (Acetone ppt) | 2.63 |
| Ag-DDA (Methanol ppt) | 7.35 |
| Ag-DDA (Acetone ppt) | 2.50 |

EXAMPLE 3

Capped particles were produced using the protocol described in Example 1 and with varying loading rates of hexadecylamine. Particles were produced that had 18% by weight hexadecylamine or 8% hexadecylamine. A commercial powder (70 nm in size) that was commercially available from Sigma-Aldrich and 40 nm powder (type 3) available from an industrial supplier (Nanodynamics, Inc. of Buffalo, N.Y.) were tested along with the two particle samples.

Figure 5:
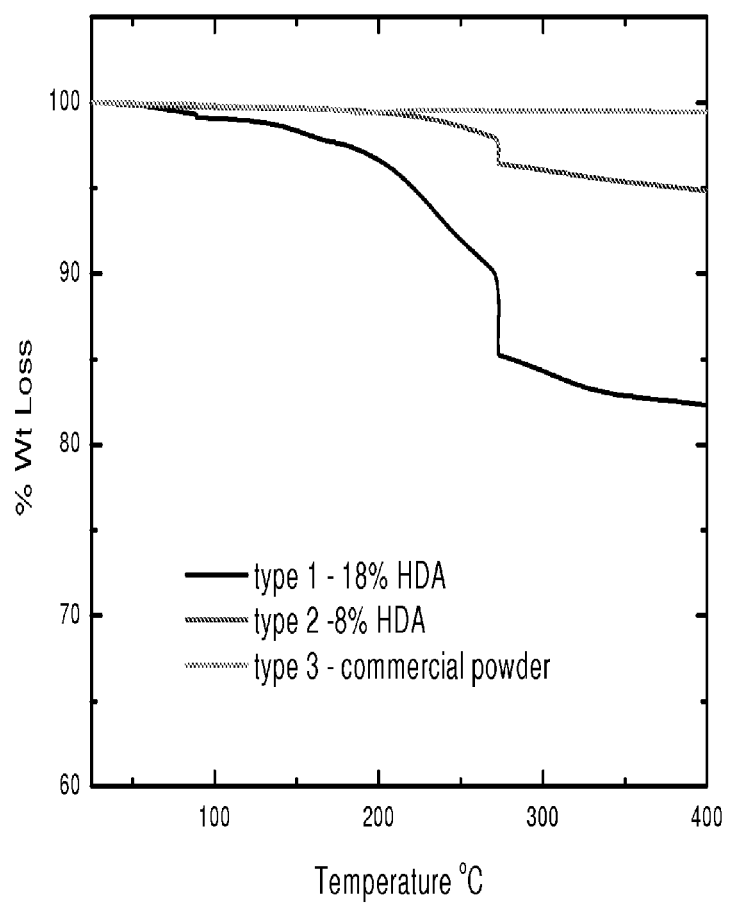
FIG. 5 is a graph showing the results of a thermogravimetric analysis of various materials, in accordance with certain examples.
Figure 6A:
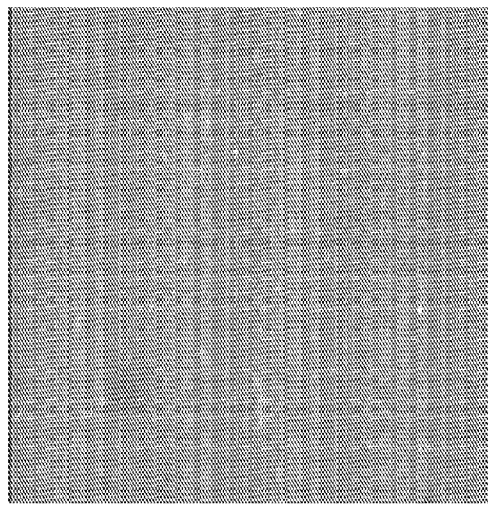
FIGS. 6A-6C show images of films produced using various inks, in accordance with certain examples.
Figure 6B:
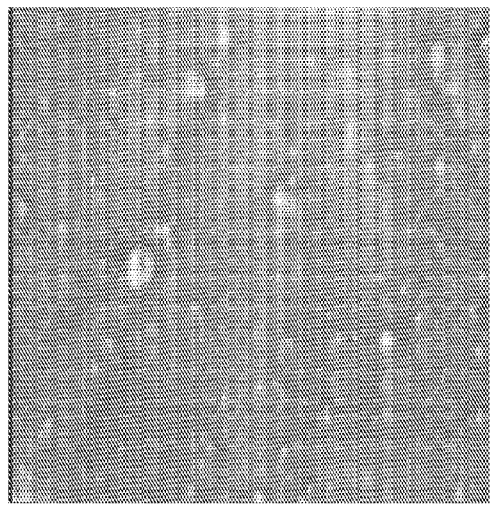
Figure 6C:
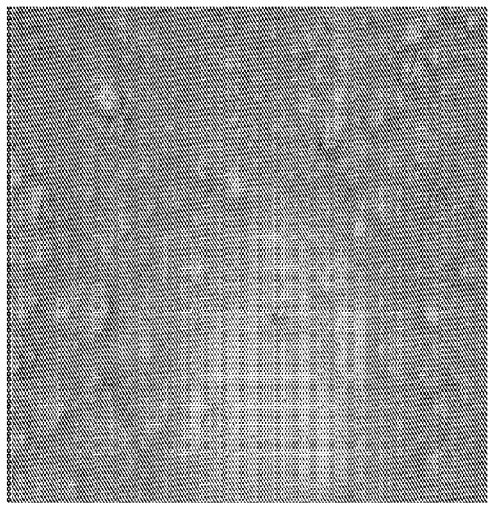

FIG. 5 shows thermo-gravimetric analysis of three different thin films produced using the three materials. Type one material was coated with 18% HDA, type 2 was coated with 8% HDA and type 3 was the commercially available powder with 2% of an organic coating. Three different silver inks were made by mixing or dispersing of one of the selected materials in toluene (about 6% solution by weight). Thin films were made on glass by spin coating the inks at similar conditions. The glass substrates with wet films were then heated at 200° C. for 100 seconds. Upon heating HDA and the solvent decomposed and evaporated to provide a surface of silver particles. Such particles easily and completely coalesced and the ink made of silver particles with 18% of HDA coating produced thin silvery and shiny films. Both of the inks made of silver nanopowder with only 8% HDA coating and made of commercially available produced dark and loose grayish films.

The conductivity of the films was measured by conventional 4-point probe meter (Lucas Labs model Pro4). The films made of 18% HDA coated nanopowder produced highly conductive films with the conductivity in the range of $30$-$40*10^4$ S/cm, which was only slightly lower then the conductivity of the bulk silver ($\sim$$62*10^4$ S/cm). The films also have had very good adhesion to the glass substrate and easily passed tape and scratch tests usually used to evaluate the adhesion properties (ASTM D3359-02 dated Aug. 10, 2002).

EXAMPLE 4

Metal particles prepared according to Example 1 above may be dispersed in toluene to provide an ink. In one illustration, metal particles may be dispersed in toluene to provide 20 weight percent particles and a solution viscosity of about 1 centiPoise. The ink may be applied to a substrate using spin coating, for example, or may be used in spin coating applications. The particles may be silver or gold particles or other illustrative metals disclosed herein.

EXAMPLE 5

Metal particles prepared according to Example 1 above may be dispersed in IsoPar® G solvent to provide an ink. In one illustration, metal particles may be dispersed in IsoPar® G solvent to provide 20 weight percent particles and a solution viscosity of about 1 centiPoise. The ink may be applied to a substrate using spin coating, for example, or may be used in spin coating applications. The particles may be silver or gold particles or other illustrative metals disclosed herein.

EXAMPLE 6

Metal particles prepared according to Example 1 above may be dispersed in an organic solvent mixture to provide an ink. In one illustration, metal particles may be dispersed in toluene/Isopar® L solvent/Isopar® V solvent (1:2:8) to provide 20 weight percent particles and a solution viscosity of about 8-9 centiPoise. The ink may be applied to a substrate using inkjet printing devices and methods, for example, or may be used in inkjet applications. The particles may be silver or gold particles or other illustrative metals disclosed herein.

EXAMPLE 7

Metal particles prepared according to Example 1 above may be dispersed in an organic solvent mixture to provide an ink. In one illustration, metal particles may be dispersed in toluene/Isopar® V solvent (1:2) and 3 weight percent polyisobutylene (PIB) to provide 20 weight percent particles and a solution viscosity of about 8-9 centiPoise. The ink may be applied to a substrate using inkjet printing devices and methods, for example, or may be used in inkjet applications. The particles may be silver or gold particles or other illustrative metals disclosed herein.

EXAMPLE 8

Metal particles prepared according to Example 1 above may be dispersed in an organic solvent mixture to provide an ink. In one illustration, metal particles may be dispersed in toluene/Isopar® V solvent (1:1) to provide 80 weight percent particles. The ink may be applied to a substrate using paste printing methods, for example, or may be used in past printing applications. The particles may be silver or gold particles or other illustrative metals disclosed herein.

EXAMPLE 9

Several inks were prepared by placing capped silver particles in toluene. Each of the capped silver particles used in the inks was prepared using the protocol of Example 1 and extracted in methanol once unless otherwise noted. The various inks are shown in the table below. The silver particles in Ink B were washed in methanol twice, and the silver particles in Ink C were extracted using acetone Inks F and G were made from commercially available silver nanoparticles. In particular, Inks F and G were made by dispersion of silver powder in toluene in the weight ratio 1:5. The ink was sonicated for 60 min prior to making the films. Ink F was made from Aldrich powder (Cat#57683-2), and Ink G was made using Nanodynamics Product Name NDSilver (Lot #31-0048).

| Ink | Capping Agent | Amount of Capping Agent (%) |
|---|---|---|
| Ink A | Hexadecylamine | 18 |
| Ink B | Hexadecylamine | 12-14 |
| Ink C | Hexadecylamine | 2-3 |
| Ink D | Dodecylamine | 8 |
| Ink E | Octylamine | 5-6 |
| Ink F (Commercial Product 1) | NA | 4 |
| Ink G (Commercial Product 2) | NA | 0.5 |

Each of the inks was used in a spin coating process to form a film. To form each film, each ink was heated on a hot plate at 250° C. for 30 seconds. After heating, each ink was spin coated onto a glass substrate using a KW-4A spin coater commercially available from Chemat Technology (Northridge, Calif.). The coating procedure involved coating at 600 rpm for 9 seconds followed by coating at 1000 rpm for 30 seconds. The resulting properties of each film are shown below. Adhesion was tested by tape test according to ASTM D3359-02 dated Aug. 10, 2002. The resistivity of each film was measured using a 4-point probe (Lucas Labs). The images shown in FIGS. 6A-6C were obtained using a Hitachi S-2500 scanning electron microscope.

| Ink | Film Description | Adhesion | Resistivity ($\mu\Omega \times$ cm) |
|---|---|---|---|
| Ink A | Shiny, smooth and uniform (FIG. 6A). | Very good, passed tape test | 3-4 |

-continued

| Ink | Film Description | Adhesion | Resistivity (μΩ × cm) |
|-----|------------------|----------|----------------------|
| Ink B | Shiny, uneven with pinholes (FIG. 6B) | Good | 3-4 |
| Ink C | Did not form a film | | ∞ |
| Ink D | Shiny, uneven, numerous pinholes (FIG. 6C) | Poor | 20-30 |
| Ink E | Does not form a film, crumbles on heating | | ∞ |
| Ink F | Does not form a film, grey agglomerates present | | ∞ |
| | Does not form a film | | |

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples. Should the meaning of the terms of any of the patents, patent applications or publications incorporated herein by reference conflict with the meaning of the terms used in this disclosure, the meaning of the terms in this disclosure are intended to be controlling.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A method of producing capped silver nanoparticles in a single phase solution, the method comprising:
    mixing silver or a silver salt with a capping agent in a single phase solution comprising ethylene glycol, ethanol and toluene;
    adding a hydrazine reducing agent to the single phase solution; and
    isolating the capped silver nanoparticles from the single phase solution.

2. The method of claim 1 further comprising removing the capping agent from the capped metal particles to provide uncapped particles.

3. The method of claim 2 further comprising dispersing the uncapped particles in a solvent.

4. The method of claim 3 further comprising mixing the dispersed uncapped particles with an additional metal to provide an alloy.

5. The method of claim 4 in which the additional metal is one or more metals selected from the group consisting of gold, palladium, platinum, copper, and tin.

6. The method of claim 3 further comprising disposing the dispersed uncapped particles on a substrate.

7. The method of claim 6 in which the disposing step comprises spin coating, inkjet printing, paste printing or combinations thereof.

8. The method of claim 2 in which the step of removing the capping agent comprises dispersing the capped particles in a solvent and heating the dispersed capped particles.

9. The method of claim 1 further comprising selecting the capping agent to be hexadecylamine.

10. The method of claim 1, further comprising adjusting relative amounts of one or more of the ethylene glycol, ethanol and toluene to achieve the single phase solution.

11. The method of claim 1, further comprising washing the isolated capped silver nanoparticles.

12. The method of claim 1, wherein an amount of the capping agent sufficient to provide at least about 2% by weight capping agent in the capped silver nanoparticles is present in the single phase solution.

13. The method of claim 12, further comprising reducing the amount of capping agent in the capped silver nanoparticles to less than about 2% by weight capping agent.

14. The method of claim 12, further comprising reducing the amount of capping agent in the capped silver nanoparticles to less than about 1% by weight capping agent.

15. The method of claim 12, further comprising reducing the amount of capping agent in the capped silver nanoparticles to less than about 0.5% by weight capping agent.

16. The method of claim 12, further comprising reducing the amount of capping agent in the capped silver nanoparticles to less than about 0.1% by weight capping agent.

* * * * *